United States Patent
Karlgaard et al.

(10) Patent No.: US 10,886,748 B1
(45) Date of Patent: Jan. 5, 2021

(54) METERING AND COMMUNICATIONS FOR DISTRIBUTED ENERGY RESOURCE DEVICES

(71) Applicant: Landis+Gyr Innovations, Inc., Alpharetta, GA (US)

(72) Inventors: Matt Karlgaard, Brainerd, MN (US); Keith Torpy, Sydney (AU)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 0 days.

(21) Appl. No.: 16/793,876

(22) Filed: Feb. 18, 2020

Related U.S. Application Data

(60) Provisional application No. 62/914,002, filed on Oct. 11, 2019.

(51) Int. Cl.
*H02J 3/38* (2006.01)
*H02J 13/00* (2006.01)
*G01R 22/06* (2006.01)
*H02H 3/52* (2006.01)

(52) U.S. Cl.
CPC .......... *H02J 3/388* (2020.01); *G01R 22/063* (2013.01); *H02H 3/52* (2013.01); *H02J 13/00002* (2020.01); *H02J 2300/24* (2020.01)

(58) Field of Classification Search
CPC .. H02J 3/388; H02J 13/00002; H02J 2300/24; G01R 22/063; H02H 3/52
USPC ......................................................... 307/64
See application file for complete search history.

(56) References Cited

U.S. PATENT DOCUMENTS

| | | | |
|---|---|---|---|
| 4,463,311 A | 7/1984 | Kobayashi | |
| 6,420,801 B1 | 7/2002 | Seefeldt | |
| 8,784,130 B2 | 7/2014 | Scott et al. | |
| 9,318,861 B2 | 4/2016 | Fulton et al. | |
| 9,437,986 B2 | 9/2016 | Knauer et al. | |
| 9,484,653 B1 | 11/2016 | Chen | |
| 9,595,815 B2 | 3/2017 | Knauer et al. | |
| 2003/0034693 A1 | 2/2003 | Wareham et al. | |
| 2008/0091625 A1 | 4/2008 | Kremen | |
| 2010/0003848 A1 | 1/2010 | Scott et al. | |
| 2010/0105226 A1 | 4/2010 | Gong et al. | |
| 2010/0306027 A1 | 12/2010 | Haugh | |
| 2013/0123997 A1 | 5/2013 | King et al. | |

(Continued)

FOREIGN PATENT DOCUMENTS

| | | |
|---|---|---|
| CN | 1403825 A | 3/2003 |
| CN | 201467023 U | 5/2010 |

(Continued)

OTHER PUBLICATIONS

Unpublished U.S. Appl. No. 16/428,118, filed May 31, 2019.
Unpublished U.S. Appl. No. 16/793,876, filed Feb. 18, 2020.

*Primary Examiner* — Hal Kaplan
(74) *Attorney, Agent, or Firm* — Kilpatrick Townsend & Stockton LLP

(57) ABSTRACT

A DER (distributed energy resource) device includes a metrology module and a communications module. The metrology module monitors the output of the DER device and the communications module provides bidirectional communications across a communications network to control the DER device. The control of the DER devices may include commands to connect the DER device to the grid, to disconnect the DER device to the grid, to connect the DER device to the premises, or to adjust a power characteristic of the output of the DER device.

23 Claims, 8 Drawing Sheets

(56) References Cited

U.S. PATENT DOCUMENTS

| | | |
|---|---|---|
| 2015/0233980 A1 | 8/2015 | Umetsu et al. |
| 2016/0181752 A1 | 6/2016 | Parks et al. |
| 2017/0168516 A1 | 6/2017 | King |
| 2017/0212160 A1 | 7/2017 | Fulton et al. |
| 2017/0346296 A1 | 11/2017 | Schamber et al. |
| 2020/0225263 A1 | 7/2020 | Karlgaard |

FOREIGN PATENT DOCUMENTS

| | | |
|---|---|---|
| CN | 201623651 U | 11/2010 |
| CN | 101976854 A | 2/2011 |
| CN | 103138291 A | 6/2013 |
| CN | 103187735 A | 7/2013 |
| CN | 105242087 A | 1/2016 |
| JP | 2011204045 A | 10/2011 |
| WO | 2003/014748 A1 | 2/2003 |
| WO | 2011/124657 A1 | 10/2011 |
| WO | 2017/205724 A1 | 11/2017 |

METERING AND COMMUNICATIONS FOR DISTRIBUTED ENERGY RESOURCE DEVICES

CROSS-REFERENCE TO RELATED APPLICATION

This application claims priority to U.S. Application No. 62/914,002, filed Oct. 11, 2019, the entirety of which is incorporated herein by reference.

FIELD OF THE INVENTION

The present invention is related to metering and communications for distributed energy resource devices, as well as a system that supports multiple distributed energy resource devices at a single premises.

BACKGROUND

In a resource distribution system, such as an electric grid that delivers electric power, a meter is used to measure and control consumption at a customer premises. The meter may include a metrology module for measuring consumption and monitoring power characteristics and a communications module for communicating with a central system, such as a head-end system, as well as other modules and components.

When a distributed energy resource (DER) device, such a solar panel array, wind turbine, water turbine, battery, an electric vehicle (EV) charger, EV, or generator, is located at a customer premises, the power generated by the DER device may be used at the premises or output to the electric grid. In some systems, a separate meter and meter socket are needed to connect the DER device to the grid. These separate devices may not allow a central system, such as a head-end system, to control the connection of the DER device to the grid. In other systems, an integrated device may connect both the DER device and the premises meter to the grid. However, these integrated devices may not provide optimum control of the DER device and may be limited to connecting only one DER device per premises. Thus, there is a need for an improved system for controlling and communicating with multiple DER devices at a premises.

SUMMARY

Each DER device includes a metrology module and a communications module. The metrology module monitors the output of the DER device and the communications module provides bidirectional communications across a communications network. The communications network enables communications between a head-end system, DER devices located at different premises, and meters. The communications include commands to control the DER devices to connect to or disconnect from an electric distribution network and to adjust a power characteristic of an output of the DER device.

The communications between the DER device and the head-end system may be routed through the meter located at the same premises as the DER device, through another device on the network, such as a gateway device, or through a cellular base station. The communications from the DER device may include information about the output of status of the DER device, such as an amount of power supplied to the grid over an interval, a time of the interval, and power characteristics of the supplied power, such as harmonics, power factor, or power quality.

The information from the DER device is analyzed by the head-end system, the meter, or an edge computing device. The analysis may include comparing the information against one or more threshold values or using it to determine another value, such as a monetary value of the supplied power. If the analysis indicates that an adjustment is needed, then a command or control instruction is generated and sent to the DER device. The command may instruct the DER device to adjust its output or to disconnect from the electric distribution network. Other commands are also possible and include commands for instructing the DER device to connect to the electric distribution network or to provide power to the premises.

These illustrative aspects and features are mentioned not to limit or define the presently described subject matter, but to provide examples to aid understanding of the concepts described in this application. Other aspects, advantages, and features of the presently described subject matter will become apparent after review of the entire application.

DETAILED DESCRIPTION

The present invention provides a system that supports communication with and control of DER (distributed energy resource) devices. Each DER device includes a metrology module and a communications module. The metrology module monitors the output of the DER device and the communications module provides bidirectional communications across a communications network to control the DER device. The control of the DER devices may include commands to connect the DER device to the grid, to disconnect the DER device from the grid, to connect or disconnect the DER device to the premises, or to adjust a parameter of the DER device. The DER device may communicate with a head-end system, a meter, or an edge computing device.

Figure 1:
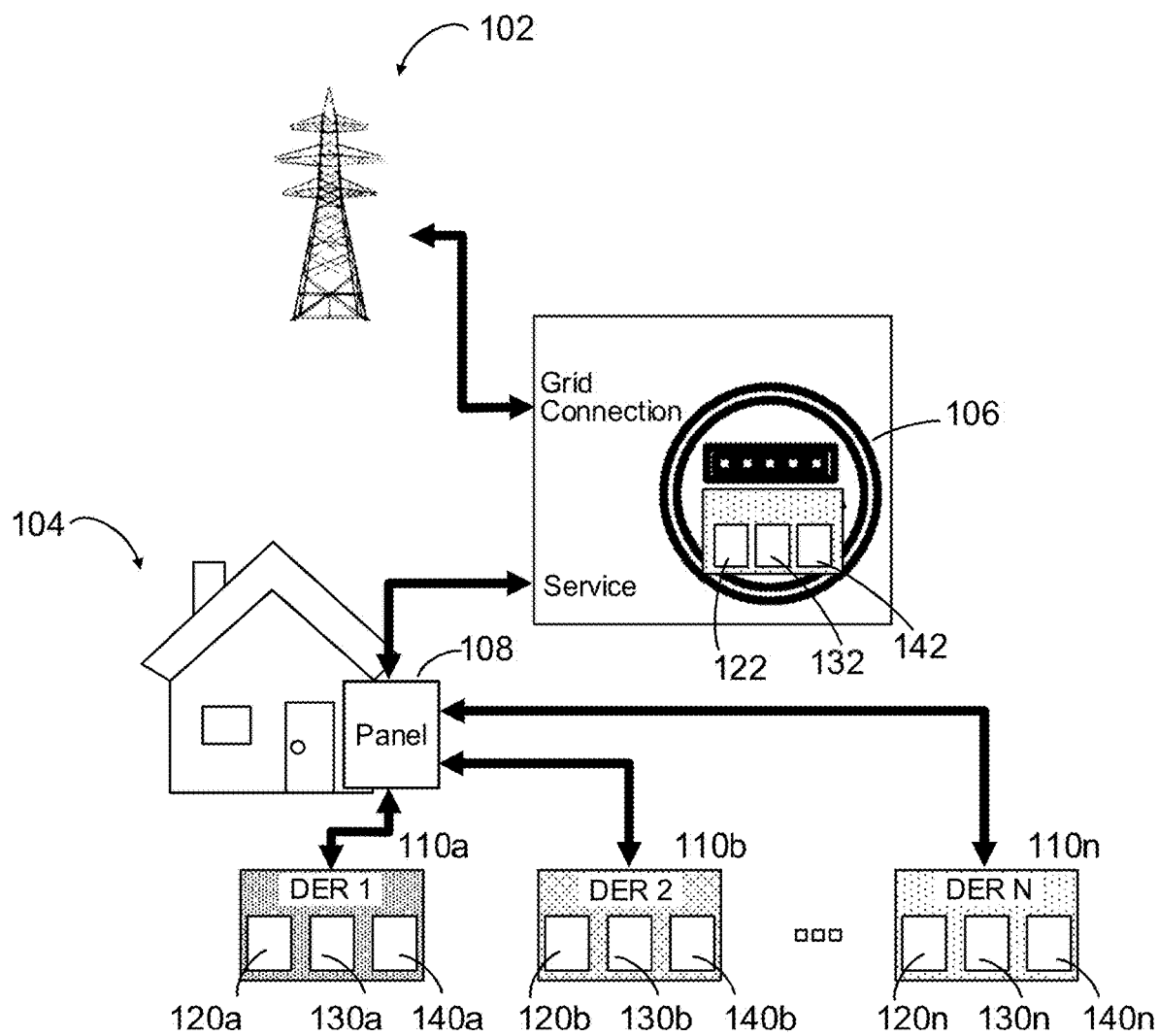
FIG. 1 is a block diagram illustrating exemplary power connections between an electric distribution network, a meter, a panel located at a premises, and multiple DER devices.

FIG. 1 illustrates exemplary power connections between an electric distribution network or grid 102, a premises 104, a meter 106, a panel 108, and multiple DER devices 110a, 110b, . . . 110n. In this example at least three DER devices are located at the same premises.

The meter 106 measures and controls electric power between the grid and the premises. The meter may include a metrology module 122, a communications module 132, and a disconnect switch 142, as well as other components. The metrology module measures consumption of electric energy and may provide billable-grade metrology and load profiling. The communications module communicates with a central or head-end system via a communications network (not shown). The metrology module and the communications module may be separate modules or may be combined into a single module. The disconnect switch controls the flow of power from the grid through the meter to the premises.

In FIG. 1, each of the DER devices 110a, 110b, 110n is connected to the grid and the premises via the panel 108. Each DER device includes a metrology module 120a, 120b, 120n, a communications module 130a, 130b, 130n, and a control device 140a, 140b, 140n, such as an inverter or a disconnect switch. The parameters or state of the control device may be controlled by a controller. The metrology module measures the electric power generated by the DER device. It provides billable-grade metrology, so that it can measure the amount of energy provided by the DER device to the premises or the grid, as well as the time when the energy is provided. The metrology module may provide load profiling, which may be use an appropriate interval length (e.g., 1 minute intervals, 5 minute intervals, 15 minute intervals) as required by the relevant regulatory authority. It may also monitor the generated power and provide power data, such as power quality and power factor data. In some systems, the metrology module is provided by a single module, such as a meter-on-chip (MOC) module. The communications module communicates with the central system via a communications network (not shown). The metrology module and the communications module may be separate modules or may be combined into a single module. The control device controls the connection of the output of the DER device to the panel.

Although FIG. 1 illustrates that the DER devices 110a, 110b, 110n are connected to panel 108, alternative configurations are possible and may be supported by the metrology modules 120a, 120b, 120n and communication modules 130a, 130b, 130n in the DER devices. The alternatives include connecting one or more DER device to a multi-port meter or a direct connection of a DER device to the grid.

The communications module in the DER device allows for low-latency bi-directional communications with the DER device. These communications may provide more or more timely information about the operation of the DER device and enable better control of the DER device than is currently available.

The metrology module and the communications module may be added to any type of DER device to enable the DER device to operate in the system of FIG. 1. These modules (or module, if combined) may be integrated into the hardware design of the DER device. There may be pads or connectors designed onto the PCB (printed circuit board) of the DER device to accommodate the addition of the modules. In some implementations, the DER device is produced by a third party and the modules are provided by the same party that provides the meter. The modules may be soldered onto the PCB or connected using a connector or wiring harness. The metrology module and the communications module in a DER device may communicate with the other components of the DER device via a wired connection, a wireless connection, or a combination thereof.

Figure 2:
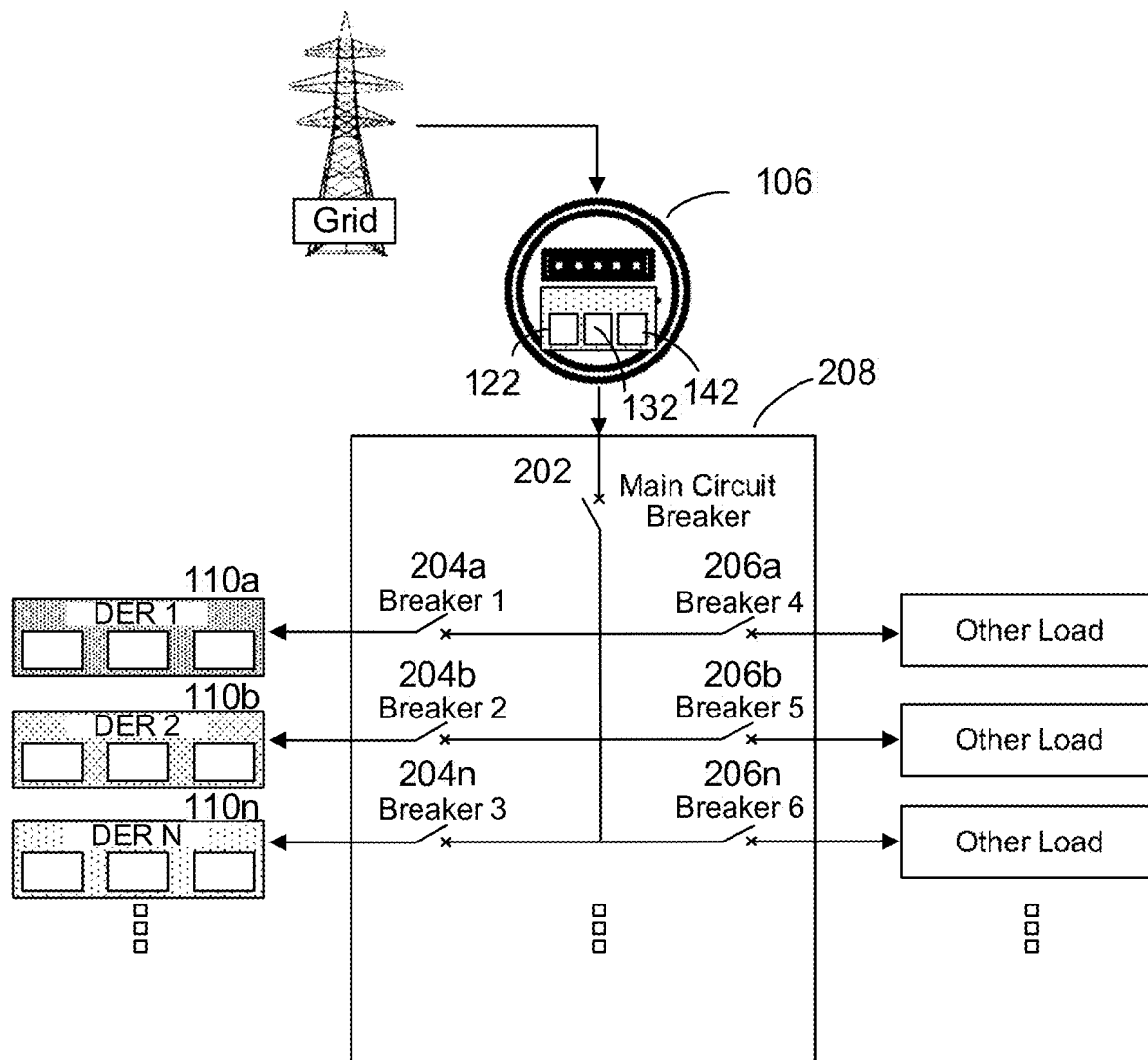
FIG. 2 is a block diagram illustrating an exemplary panel connected to a meter, multiple DER devices, and multiple loads.

The meter 106 connects the premises to the grid via the panel 108. The panel may contain a main circuit breaker that controls the connection of the premises to the meter, as well as additional circuit breakers for the DER devices and the loads located at the premises. FIG. 2 illustrates an exemplary panel 208 with a main circuit breaker 202, a circuit breaker for each DER device 204a, 204b, 204n, and circuit breakers for premises loads 206a, 206b, 206n.

Communications Using a Meter

Figure 3:
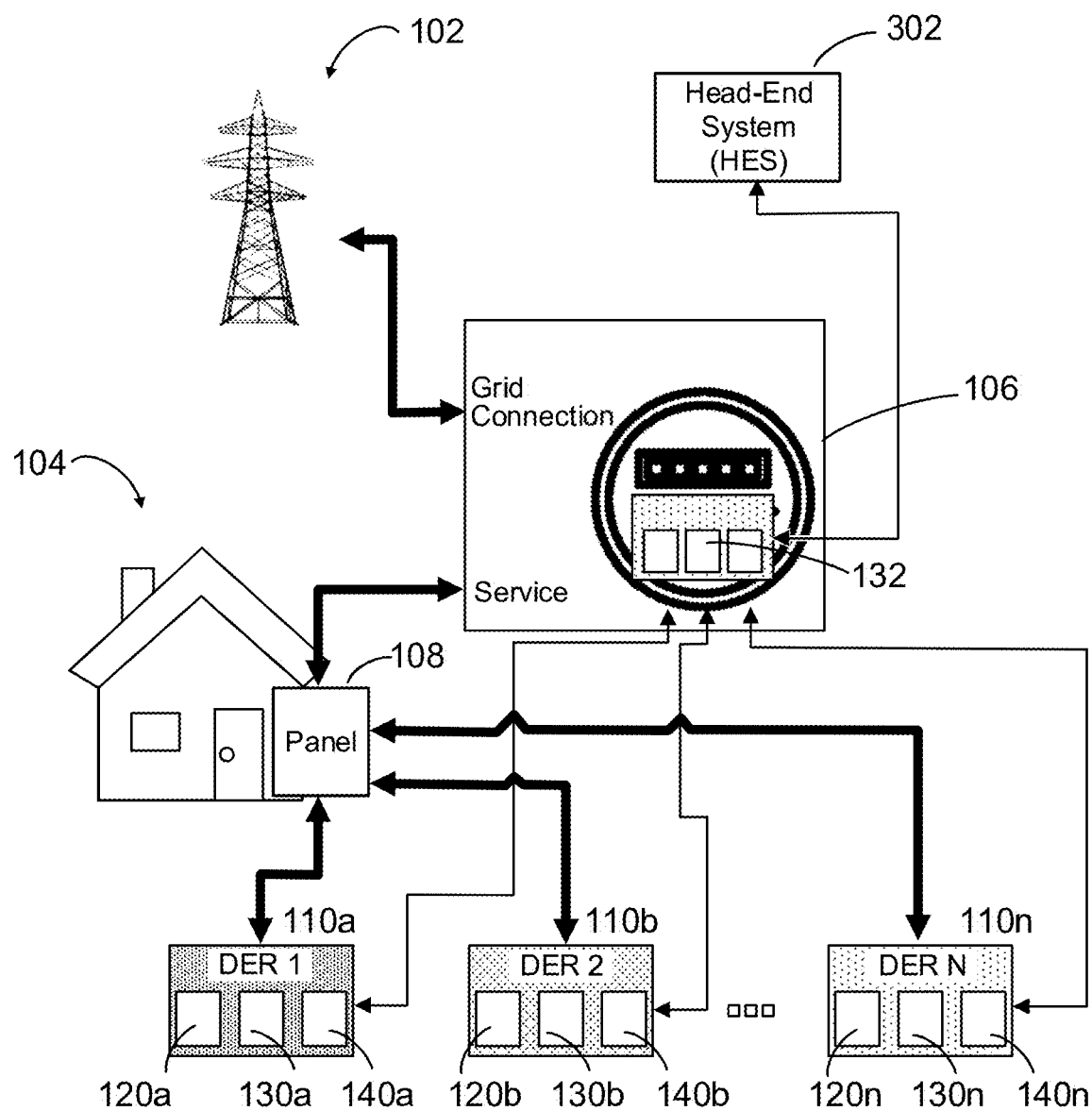
FIG. 3 is a block diagram illustrating a portion of an exemplary communications network for communications between a head-end system, a meter, and multiple DER devices.

In addition to the power connections shown in FIGS. 1 and 2, the meter and the DER devices are connected via one or more communications networks. FIG. 3 illustrates a portion of one exemplary communications network. The communications network includes communications channels between the meter 106 and DER devices 110a, 110b, 110n. Each of the communications modules in the DER devices communicates with the communications module in the meter. The communications channels may be wired or wireless and may use any type of communications protocol, including proprietary or non-proprietary protocols. One example is the Zigbee communications protocol. The communications modules in the DER devices may communicate information about the energy generated or supplied to the grid, as well as information about the status of the devices.

The communications module in the meter may receive commands or control instructions sent by the head-end system 302 and route the commands to the appropriate DER device. It may also receive communications from the DER devices and transmit the communications to the head-end system.

In addition to, or in the alternative to routing communications between the head-end system and the DER devices, the meter may generate commands and send them to the one or more of the communications modules in the DER devices. The meter may also receive information from the DER devices. The information may be provided to the head-end system and/or used by the meter.

In FIG. 3 all communications between a DER device and another device are routed through the meter at the same premises. The meter may communicate with the DER devices and with other devices on the communications network using the same network protocol or may use one network protocol to communicate with the DER devices and a different network protocol to communicate with the other devices on the communications network.

In some implementations, the meter receives information from the DER devices, aggregates the information, and then sends the aggregated information to the head-end system. In other implementations, the meter simply routes information received from the DER devices to the head-end system without aggregation.

As an alternative to the communications between the DER devices and the head-end system passing through the meter as shown in FIG. 3, one or more of the DER devices may be configured so that communications between the head-end system and the DER device pass through nodes others than the meter. For example, communications between the head-end system 302 and DER device 110a may be routed through a device on the network other than the meter 106 at the same premises.

Figure 4:
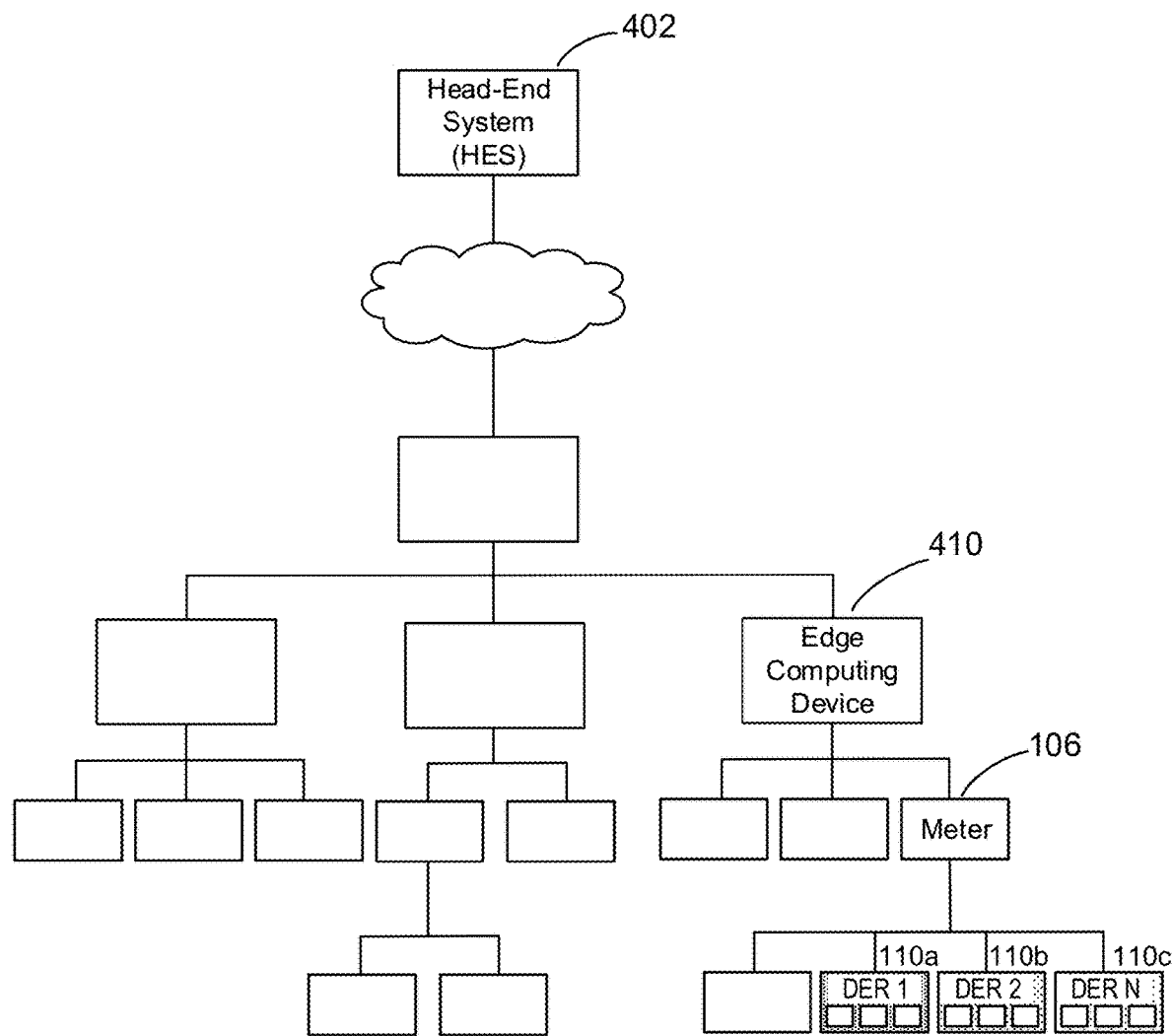
FIG. 4 is a block diagram illustrating a portion of an exemplary communications network topology for the communications network of FIG. 3.

In any of these examples, communications for other devices on the network may be routed through the meter 106. As shown in FIG. 4, the meter may be connected to a network of meters and other devices and communications between the head-end system 402 and the meter 106 may be communicated across multiple devices over one or more networks.

In some networks, the communications modules of the meter and/or the DER devices may communicate with a device that provides edge computing services. An edge computing service or edge computing device 410 may provide lower latency communication and control, since it is located topologically closer to the DER device on the communications network.

Communications Using a Gateway Device

Figure 5:
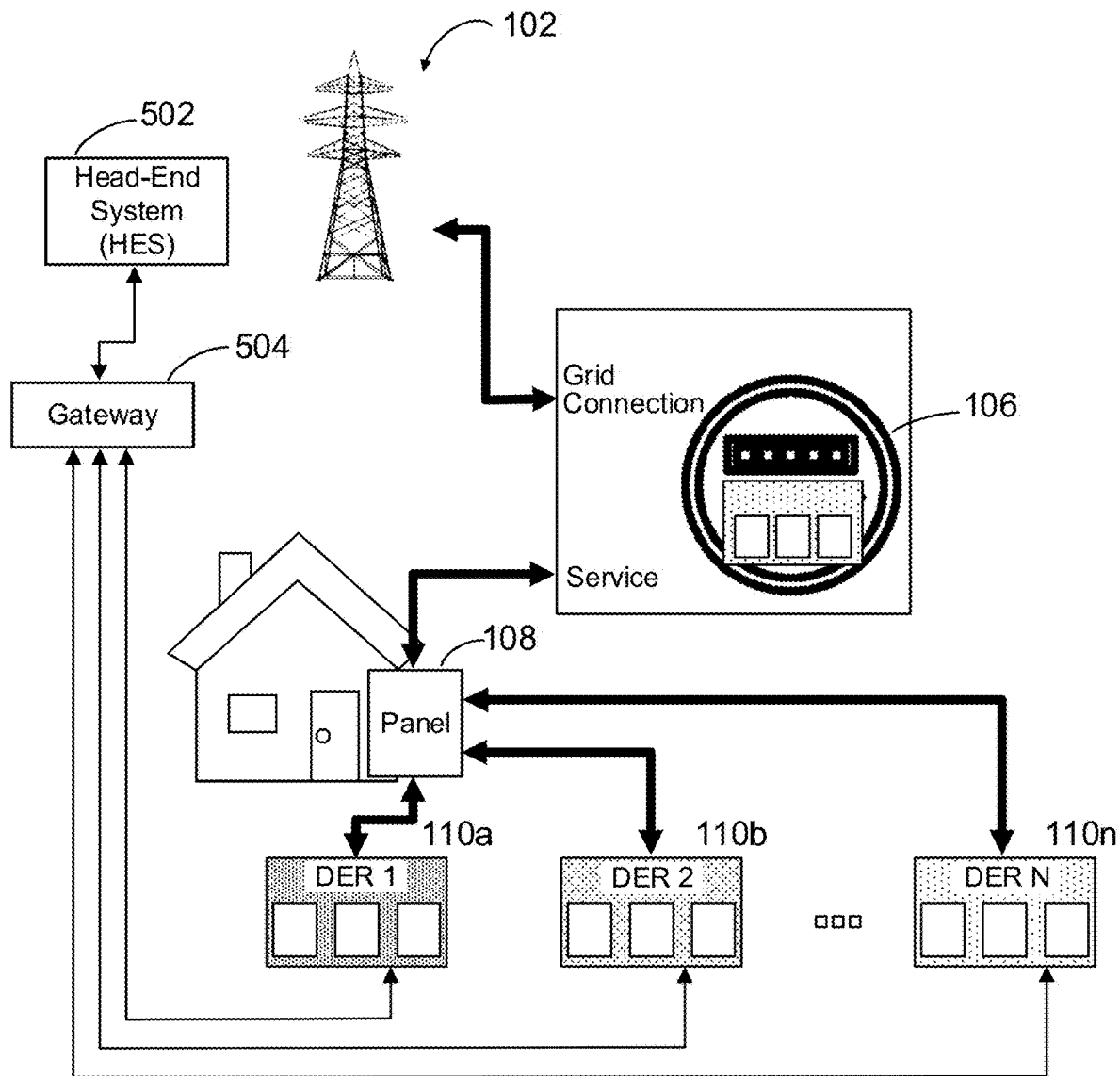
FIG. 5 is a block diagram illustrating a portion of an exemplary communications network for communications between a head-end system, a gateway device, a meter, and multiple DER devices.

FIG. 5 illustrates another exemplary communications network. In FIG. 5 the communications modules in the DER devices 110a, 110b, 110n communicate with a gateway device 504. The communications with the gateway device may use any type of communications protocol, including proprietary or non-proprietary protocols. Some examples are the Zigbee, Wi-Sun, or WiFi communications protocols. The communications modules in the DER devices may communicate information about the energy generated or provided to the grid, as well as information about the status of the devices.

Communications between the meter and the head-end system may not be routed through the gateway device. Instead, the meter may communicate with the head-end system as shown in FIG. 3 or may communicate with the head-end system over a PLC network. Alternatively, the meter may communicate via the gateway device.

The gateway device may be located at or near the premises. The gateway device communicates with the head-end system 502 through one or more networks. In addition to communications functions, the gateway device may be an edge computing device that provides edge computing services, such as services to support metering and control of the DER devices. The head-end system may communicate with the DER devices via communications routed through the gateway device.

Communications Using a Premises Gateway Device

Figure 6:
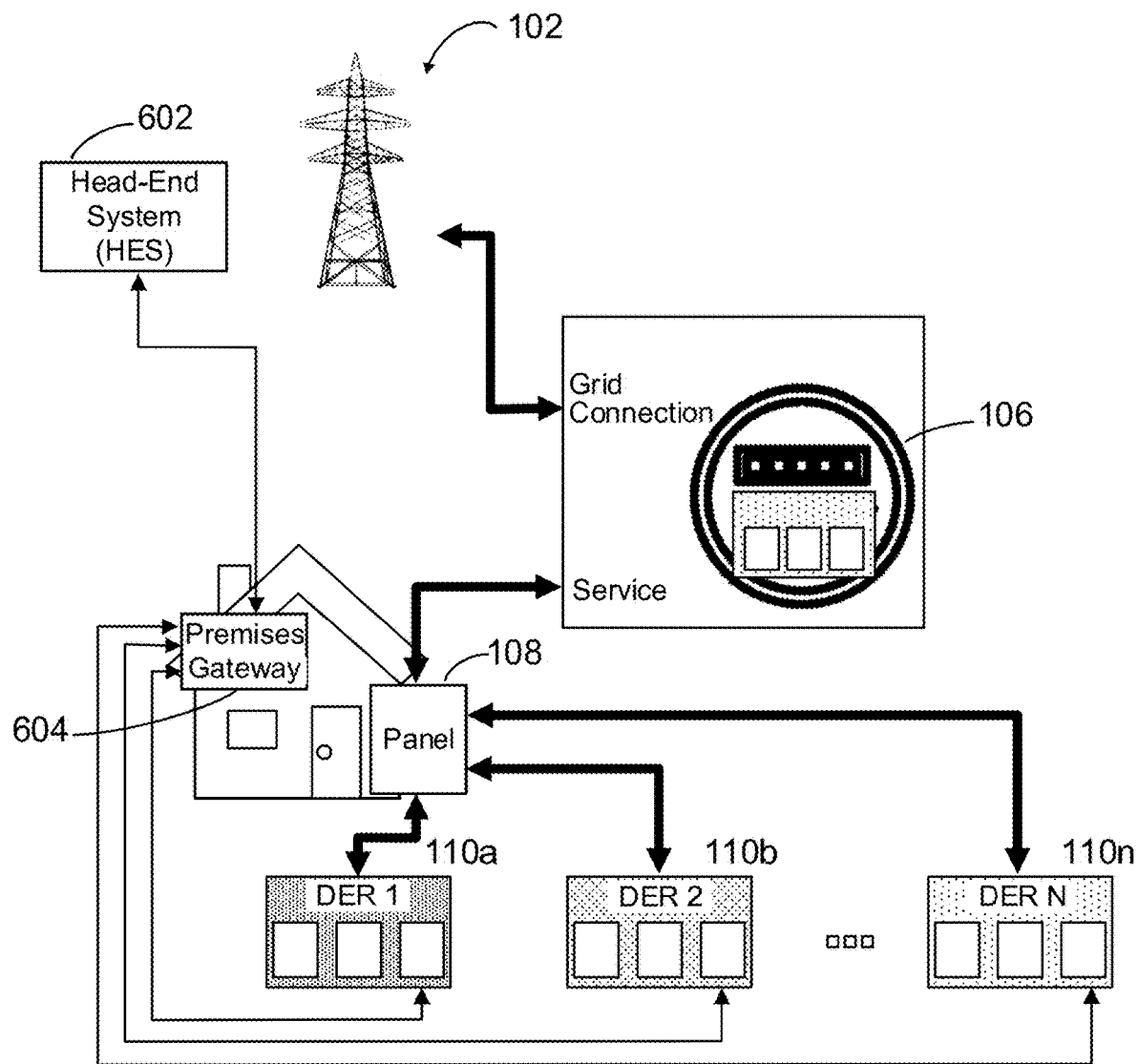
FIG. 6 is a block diagram illustrating a portion of an exemplary communications network for communications between a head-end system, a premises gateway device, a meter, and multiple DER devices.

FIG. 6 illustrates another example of communications channels for the meter 106 and DER devices 110a, 110b, 110n of FIG. 1. In FIG. 6 the communications modules in the DER devices communicate with a gateway device 604 located at the premises, such as a premises gateway device or home gateway device. The communications with premises gateway device 604 may use any type of communications protocol, including proprietary or non-proprietary protocols. Some examples are the Zigbee, Wi-Sun, or WiFi communications protocols. The communications modules in the DER devices may communicate information about the energy generated or provided to the grid, as well as information about the status of the devices.

Communications between the meter and the head-end system 602 may not be routed through the premises gateway device. Instead, the meter may communicate with the head-end system as shown in FIG. 3 or may communicate with the head-end system over a PLC network. Alternatively, the meter may be connected to the premises gateway device.

The premises gateway device may be located at the premises. For example, a home gateway device may be located inside or outside a building located at the premises. The home gateway device communicates with the head-end system through one or more networks. In addition to communications functions, the premises gateway device may also provide edge computing services, including metering and control of the DER devices.

Communications Using a Cellular Base Station

Figure 7:
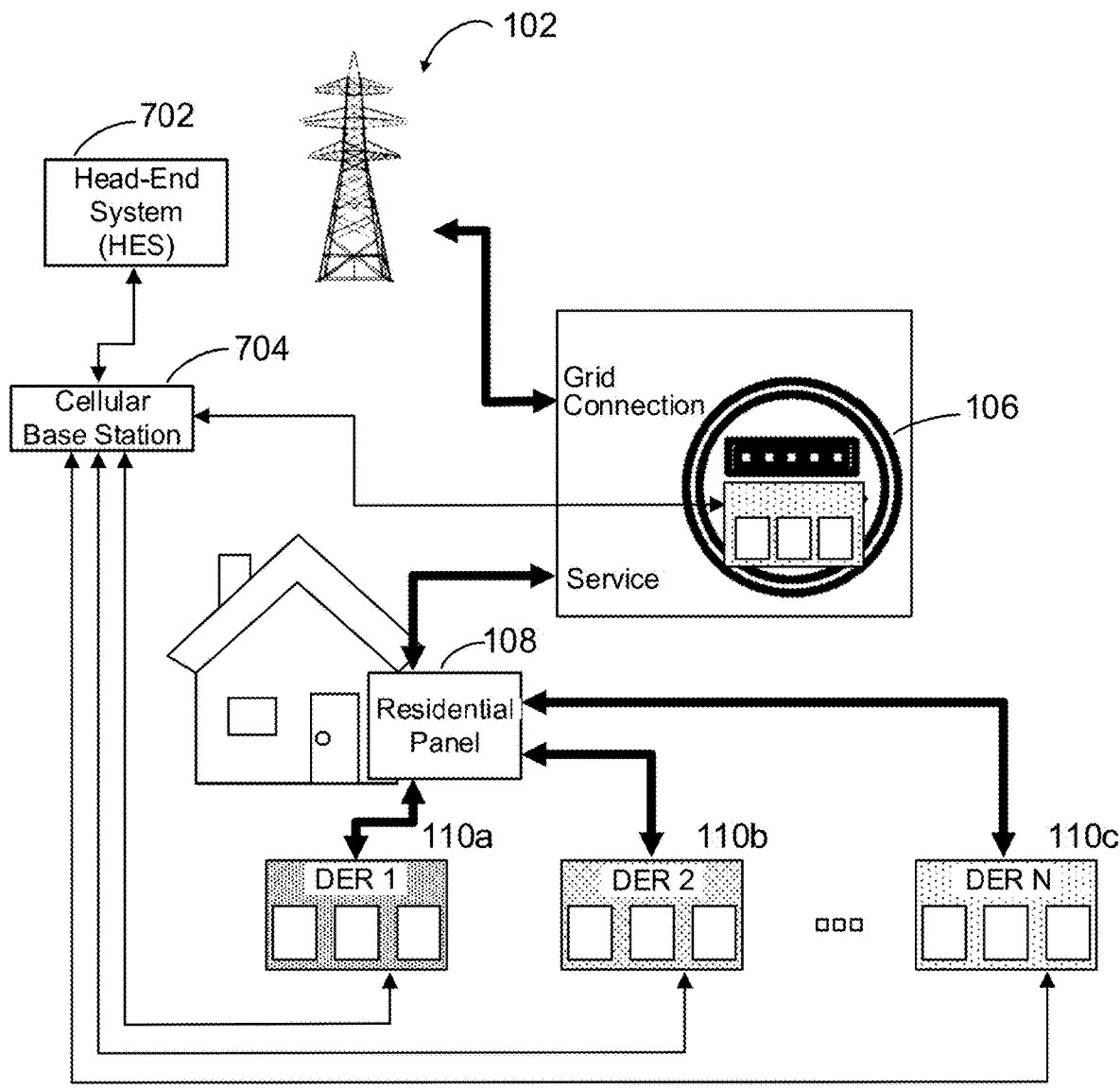
FIG. 7 is a block diagram illustrating a portion of an exemplary communications network for communications between a head-end system, a cellular base station, a meter, and multiple DER devices.

FIG. 7 illustrates another exemplary communications network. In FIG. 7, the communications modules in the meter 106 and DER devices 110a, 110b, 110n include cellular radios. The communications module in the meter and the communications modules in the DER devices communicate with a cellular base station 704 via a cellular network. The cellular network may be a public or a private cellular network. The communications modules in the DER devices may communicate information about the energy generated or provided to the grid, as well as information about the status of the devices.

The head-end system 702 communicates with the meter and with the DER devices via the cellular base station 704. Although not shown in FIG. 7, communications between the cellular base station and the head-end system may use additional networks and network devices.

As an alternative to the communications module of the meter communicating through the cellular base station as shown in FIG. 7, the meter may communicate with the head-end system using a different network than that used by the DER devices.

Exemplary Communications with a DER Device

The inclusion of a metrology module and a communications module in a DER device and the connection of the DER device to a communications network, as described above support improved control and connection of the DER devices.

The metrology module in the DER device monitors the power generated by the DER device to determine information about the power. The information includes any information or data that can be metered or is otherwise available to the metrology module or the DER device including, but not limited to, the amount of power provided to the grid, the time the power is provided to the grid, and the characteristics of the power (e.g., power factor, power quality, harmonics) provided to the grid. The communications module in the DER device may communicate the information to the meter at the same premises, the head-end system, and/or an edge computing device. The meter, head-end system, and/or edge computing device may use the information to control the DER device or may aggregate the information with information from other devices on the grid and use that information to make decisions to control one or more of the devices, including the DER device.

A user, including a user associated with a utility or a customer, may monitor and control the generation or use of energy via a user interface. For example, a user may receive information on the energy flow to or from the grid, the production or consumption of energy by one or more DER devices, the consumption of energy by loads, information on power quality, power factor, or other metering parameters from a DER device or the grid, or billing and rate information via the user interface. The user may issue control commands to control the DER devices or the functions of the meter. The user interface may be presented on a display device located on the premises or may be presented to the user via another type of device, including an internet/web portal or a portable device, such as a smart phone.

The user interface may allow a user to configure the system, including setting certain threshold values, so that the system may control the DER devices and their connections based on factors such as the detected conditions of the grid, the output of a DER device, and the current rate (i.e., cost per unit of energy) in a system that uses a variable rate structure. Some representative commands are discussed below.

The meter, head-end system, or edge computing device may generate commands to connect or disconnect the DER device to the grid or the panel. If the meter determines that the DER device is to be connected to the grid and allowed to supply power to the grid, the meter may send a command to the DER device instructing it to connect its output to the panel. The meter may also control other devices or switches to enable a DER device to supply power to the grid. The timing of the activation of the connections may be controlled to allow the output of the DER device time to synchronize to the grid. The connection or disconnection of the DER device and the grid may also be done at a specific time that is most advantageous to the user and/or utility based on changing rate structures. A utility may disconnect or not allow connection of a DER device to the grid based on the DER device's ability to meet power quality standards.

If the head-end system determines that the DER device is to be connected to the grid, the head-end system may send a command to the meter instructing it to connect the DER device to the grid. The meter may then generate and send a command to the DER device instructing it to connect its output to the panel and may control other devices or switches to connect the DER device to the grid. Alternatively, the head-end system may send a command to the DER device instructing it to connect its output to the panel and may send a separate command to the meter instructing it to allow the DER device to supply power to the grid.

If the meter determines that the DER device is to be disconnected from the grid, the meter may generate and send a command to the DER device instructing the DER device to disable its output to the panel and may control any other devices needed to disable the DER device from providing power to the grid. If the head-end system determines that the DER device is to be disconnected from the grid, the head-end system may send a command to the meter instructing it to disconnect the DER device from the grid. The meter may then generate and send a command to the DER device instructing it to disable its output to the panel and may control other devices or switches, as needed to disconnect the DER device from the grid. Alternatively, the head-end system may send a command to the DER device instructing it to disconnect its output from the panel and may send a command to the meter to prevent the DER device from supplying power to the grid. An edge computing device may disconnect a DER device from the grid in a manner similar to that used by the head-end system.

In one example, the DER device includes a solar panel that is connected to the grid and supplying power to the grid. The metrology module of the DER device monitors the output of the solar panel to detect harmonics. The communications module of the DER device may communicate the harmonics information to the head-end system. The head-end system may analyze the harmonics information to determine whether a configurable threshold is exceeded. If the harmonics generated by the solar panel exceed the threshold, then the head-end system may send a command to the DER device and/or the meter to disconnect the solar panel from the grid. In response, the DER device may disconnect the output of the solar panel from the panel.

In another example, after the DER device is connected to and supplying power to the grid, the metrology module of the DER device monitors the output to detect one or more power characteristics. Information about the power characteristics may be communicated to the head-end system. The head-end system may issue commands or take other action based on the characteristics of the generated power. For example, a head-end system may monitor power quality and power factor data received from a DER device to determine a value of the power provided to the grid by a DER device (e.g., a lower price or value may be associated with poor power quality or power factor) or to determine whether to disconnect the DER device from the grid (e.g., when the generated power has a negative impact on the grid).

If the information about the power characteristics is communicated to the meter, the meter may determine that an adjustment is needed and may send a command to the DER device. In one example, the command instructs the DER device to adjust the power factor of an inverter associated with the output of the DER device.

Figure 8:
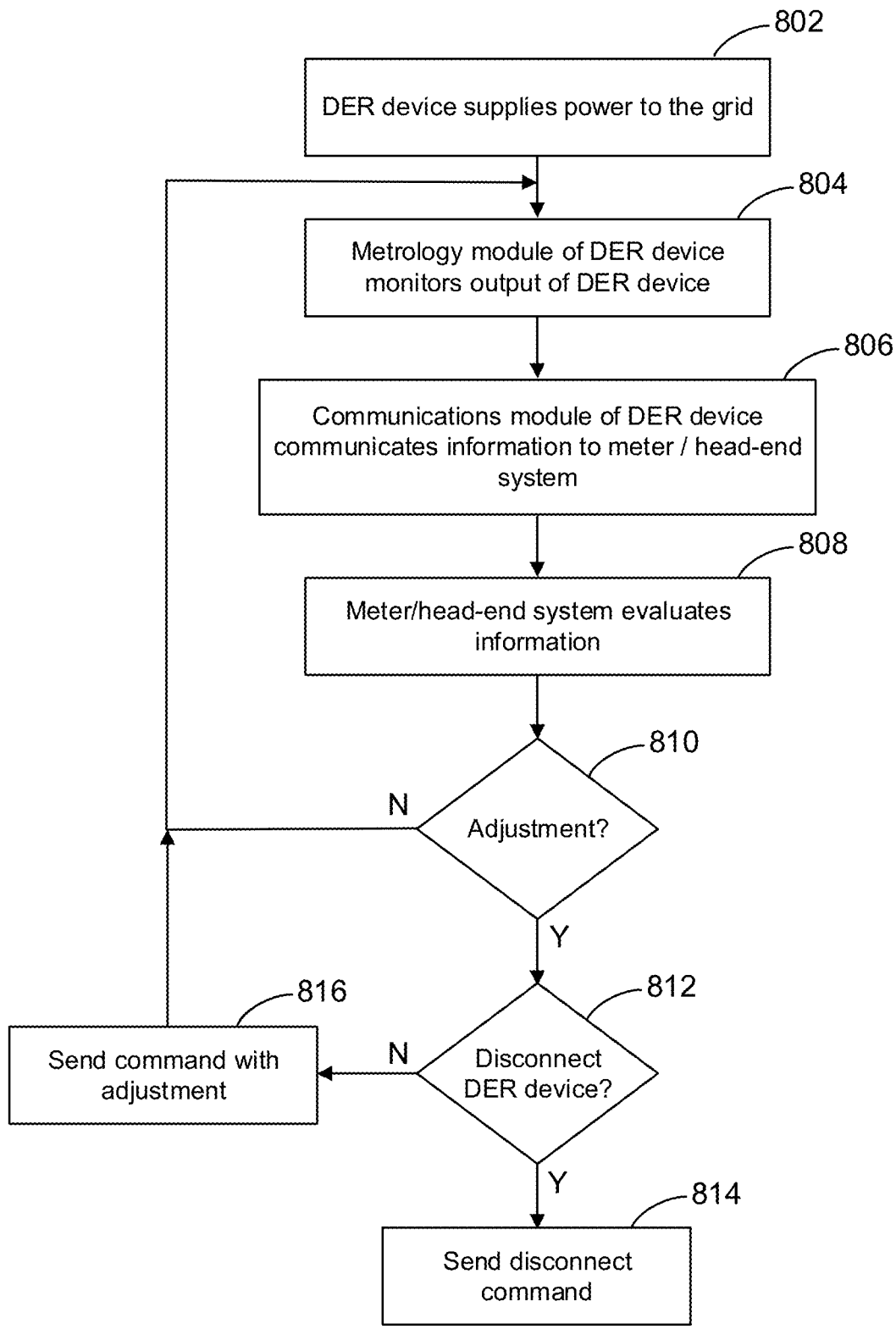
FIG. 8 is a flow diagram illustrating an exemplary method for controlling a connection of a DER device to an electric distribution network.

An exemplary method of controlling a DER device is shown in FIG. 8. The DER device is supplying power to the grid at 802. The metrology module of the DER device monitors the output of the DER device at 804 to collect information about the output. The communications module of the DER device communicates the information to the meter and/or the head-end system at 806. The information may include an amount of power supplied to the grid over an interval, a time of the interval, power characteristics of the supplied power, etc. The device or system that receives the information evaluates it at 808. The evaluation of the information may include comparing it against one or more threshold values or using it to determine another value, such as a monetary value of the supplied power. If the evaluation indicates that no adjustment is needed, then the No branch of 810 is followed back to 804.

If the evaluation indicates that an adjustment is needed, then the Yes branch of 810 is followed to 812. If the adjustment requires that the DER device is disconnected from the grid, then the Yes branch of 812 is followed to 814 and one or more commands to disconnect the DER device are communicated to the DER device and/or the meter. If the adjustment does not require that the DER device is disconnected from the grid, then the No branch of 812 is followed to 816 and one or more commands to adjust the output of the DER device are sent to the DER device and/or the meter. The method then returns to 804. Although FIG. 8 describes that the DER device communicates with a head-end system or a meter, the DER device may also communicate with an edge computing device, which may perform similar functions to those performed by the meter or the head-end system.

When the DER device is a device that can both consume power from the grid and supply power to the grid, such as an EV, an EV charger, or a battery system, the meter, head-end system, or edge computing device may control when the DER device consumes power from the grid and when the DER device supplies power to the grid. The commands may consider information such as current or historic demand, rate in effect for a certain time period, and charge level of the DER device. In addition to controlling when the DER device may consume power from the grid, the commands may also control the rate of energy transfer from the grid to the DER device or the rate of energy transfer from the DER device to the grid.

For example, the head-end system may consider the overall demand of the grid when controlling the DER device. During periods of high demand the head-end system may decide not to allow the DER device to consume power, and may allow it to supply power. The edge computing device may consider loading on a local transformer or other local distribution device to determine when to allow each DER device within a neighborhood to consume power to ensure that the local distribution device is not overloaded and to ensure that each DER device in the neighborhood is allowed time to charge. The meter may consider the current rate in effect to control the DER device. When the rate is low or below a certain charging rate threshold, the meter may decide to allow the DER device to charge. When the rate is high or above a certain supply rate threshold, the meter may allow the DER device to provide power to the grid.

The commands may include commands that disconnect the premises from the grid and allow the DER device to provide power to the premises. For example, if the meter detects a power outage on the grid, the meter may generate a command to the DER device to connect the DER device to the panel. The meter may also control other devices to enable the DER device to power the premises while preventing power from entering the grid.

These and other commands ensure a good balancing of the loads and DER devices located at the premises, which helps maintain the stability of the grid.

The operations of the head-end system, gateway devices, metrology modules and communications modules described herein may be performed by any suitable computer system. The computing system may include one or more processing elements that execute computer-executable program code stored in a memory device. The memory device may include any suitable computer-readable medium for storing program code and data. The computing system may execute the program code and configure the processing element to perform one or more of the operations described herein. The computing system may include other components, such as one or more network interface devices for establishing a connection to and communicating on a network, and an input/output device, such as a display device.

While the present subject matter has been described in detail with respect to specific aspects thereof, it will be appreciated that those skilled, upon attaining an understand of the foregoing, may readily produce alternations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A method for controlling a connection of a DER (distributed energy resource) device located at a premises to an electric grid, comprising:
   controlling, by a system remote from the premises, a connection of the DER device to the electric grid to allow the DER device to supply power to the electric grid;
   receiving, at the system remote from the premises, a communication from the DER device, wherein the communication from the DER device includes power data that describes a power characteristic of the power generated by the DER device and supplied to the electric grid;
   analyzing, at the system remote from the premises, the power data to determine whether the power characteristic exceeds a threshold;
   when the power characteristic exceeds the threshold, generating, by the system remote from the premises, at least one command to disconnect an output of the DER device from the electric grid; and
   transmitting, by the system remote from the premises, the at least one command to disconnect the output of the DER device from the electric grid, wherein the command to disconnect the output of the DER device is routed across a communications network that includes the DER device.

2. The method of claim 1, wherein the at least one command to disconnect the output of the DER device from the electric grid comprises a command to the DER device to control a control device to disconnect the output of the DER device.

3. The method of claim 1, wherein the at least one command to disconnect the output of the DER device from the electric grid comprises a command to a meter located at the premises to disconnect the output of the DER device.

4. The method of claim 1, wherein the system remote from the premises is a head-end system, further comprising:
   receiving, at the head-end system, a second communication from the DER device, wherein the second communication includes an amount of energy supplied to the electric grid by the DER device over an interval and a time associated with the interval.

5. The method of claim 4, further comprising:
   determining a value of the amount of energy supplied to the electric grid by the DER device over the interval based on the amount of energy, the time associated with the interval, and the power data.

6. The method of claim 1, wherein the system remote from the premises is an edge computing device.

7. The method of claim 1, further comprising:
   receiving, at the system remote from the premises, a second communication from a second DER device, wherein the second communication from the second DER device includes power data that describes a power characteristic of power consumed by the second DER device and received from the electric grid; and
   transmitting, by the system remote from the premises, at least a second command to connect the output of the second DER device to the electric grid, wherein the command to connect the output of the second DER device is routed across the communications network, and the communications network includes the second DER device.

8. A system for controlling a connection of a DER device located at a premises to an electric grid, comprising:
   a communications module for bidirectional communications between the DER device and a system remote from the premises, wherein communications between the communications module and the system remote from the premises are routed through a meter located at the premises;
   a controller for controlling a control device based on a command received by the communications module, wherein the control device controls a connection of an output of the DER device to a panel located at the premises; and
   a metrology module for measuring an amount of energy supplied to the electric grid by the output of the DER device over an interval and associating a time with the interval, and for monitoring power characteristics associated with the energy supplied to the electric grid.

9. The system of claim 8, further comprising:
   the panel having a first interface configured to connect the DER device to the panel, a second interface configured to connect a second DER device to the panel, a third interface configured to connect the meter to the panel, a first circuit breaker associated with the DER device, a second circuit breaker associated with the second DER device, and a third circuit breaker associated with the meter.

10. The system of claim 8, wherein communications between the communications module and the meter are wireless communications.

11. The system of claim 8, wherein the communications module and the metrology module are integrated into the DER device.

12. The system of claim 8, wherein the controller controls the control device based on a command generated by the meter and received by the communications module.

13. The system of claim 8, wherein the DER device supplies power to the premises when a disconnect switch in the meter is open, the control device enables the DER device to provide power to the panel, and the panel connects the DER device to at least one load at the premises.

14. The system of claim 8, wherein the DER device is a solar device and the control device is an inverter.

15. The system of claim 8, wherein the controller controls the control device based on a variable rate structure to supply energy to the electric grid when a current rate exceeds a supply rate threshold.

16. The system of claim 8, wherein the metrology module is configured for measuring an amount of energy received from the electric grid by the DER device over a second interval and associating a time with the second interval.

17. A system for communicating with a plurality of DER devices located at a premises, comprising:
- a first communications module associated with a first DER device, wherein the first DER device is located at the premises and is connected to a panel;
- a second communications module associated with a second DER device, wherein the second DER device is located at the premises and is connected to the panel;
- a gateway communications module associated with a gateway device, wherein the gateway communications module communicates with the first communications module, the second communications module, and a central system; and
- a third communications module associated with a meter, wherein the meter is located at the premises and is connected to the panel, wherein the third communications module communicates with the central system;
- wherein the gateway communications module receives a first control instruction from the central system and transmits the first control instruction to the first communications module, and wherein the first DER device controls energy generated by the first DER device based on the first control instruction.

18. The system of claim 17, wherein the first DER device controls a first control device of the first DER device to disconnect the first DER device from an electric grid based on the first control instruction, and wherein the gateway communications module receives a second control instruction from the central system and transmits the second control instruction to the second communications module, wherein the second DER device controls a second control device of the second DER device to connect the second DER device to the electric grid based on the second control instruction.

19. The system of claim 17, wherein communications between the third communications module and the central system are routed through the gateway communications module.

20. The system of claim 17, wherein the gateway device is located at the premises.

21. The system of claim 17, wherein the gateway communications module is a cellular base station and the first communications module and the second communications module are cellular radios.

22. The system of claim 17, wherein the first DER device controls energy generated by the first DER device based on the first control instruction by adjusting a parameter of a first control device of the first DER device.

23. The system of claim 17, wherein the gateway communications module receives a second control instruction from the central system and transmits the second control instruction to the first communications module, and wherein the first DER device controls energy consumed by the first DER device based on the second control instruction.

* * * * *